United States Patent [19]

Sato

[11] Patent Number: 5,149,968
[45] Date of Patent: Sep. 22, 1992

[54] SCANNING ELECTRON MICROSCOPE
[75] Inventor: Mitsugu Sato, Katsuta, Japan
[73] Assignee: Hitachi, Ltd., Tokyo, Japan
[21] Appl. No.: 755,844
[22] Filed: Sep. 6, 1991
[30] Foreign Application Priority Data
  Sep. 6, 1990 [JP] Japan .................. 2-234357
[51] Int. Cl.$^5$ .................. H01J 37/28; H01J 37/244
[52] U.S. Cl. .................. 250/310; 250/397
[58] Field of Search .................. 250/310, 397

[56] References Cited
U.S. PATENT DOCUMENTS

| | | | |
|---|---|---|---|
| 4,442,355 | 4/1984 | Tamura et al. | 250/397 |
| 4,893,009 | 1/1990 | Kuroda | 250/310 |
| 4,896,036 | 1/1990 | Rose et al. | 250/310 |

FOREIGN PATENT DOCUMENTS

| | | |
|---|---|---|
| 59-134540 | 8/1984 | Japan . |
| 61-99960 | 6/1986 | Japan . |
| 61-131353 | 6/1986 | Japan . |

Primary Examiner—Jack I. Berman
Attorney, Agent, or Firm—Antonelli, Terry Stout & Kraus

[57] ABSTRACT

This invention relates to a scanning electron microscope for detecting secondary electrons from above an objective lens and obtaining an observation image, wherein a shield electrode is disposed for shielding an electric field on an optical axis in order to prevent a primary electron beam from being bent by the electric field generated by a secondary electron detector, a mechanism is provided so as to move the shield electrode to a first position at which the shield electrode shields the electric field on the optical axis and to a second position at which a secondary electron can be collected sufficiently by the electric field, and the shield electrode is moved to the first position during observation by a low acceleration voltage and to a second position during observation by a high acceleration voltage.

7 Claims, 4 Drawing Sheets

SCANNING ELECTRON MICROSCOPE

BACKGROUND OF THE INVENTION

This invention relates to a scanning electron microscope and more particularly, to a scanning electron microscope for detecting a secondary electron from above an objective lens.

To accomplish high resolution of a secondary electron image, aberration of a lens is preferably reduced as much as possible by reducing the focal length of an objective lens. Recently, therefore, a so-called "in-lens system" scanning electron microscope, which inserts a sample into the gap of an objective lens to reduce the focal length of the objective lens, has gained a wide application.

In the in-lens system scanning electron microscope, a secondary electron detector is disposed above the objective lens in order to detect a secondary electron from above the objective lens, and this secondary electron detector generates a secondary electron leading-out electric field.

In such an in-lens system scanning electron microscope, however, a primary electron beam emitted by a low acceleration voltage is bent by the secondary electron leading-out field and passes outside the optical axis of the objective lens, so that it receives an off-axis aberration of the lens and a secondary electron image having high resolution cannot be obtained.

The bend of the primary electron beam can be reduced by reducing the leading-out field of the secondary electron detector but in such a case, it becomes difficult to lead out a sufficient quantity of secondary electrons and a secondary electron image having high resolution cannot be obtained.

To eliminate such a problem, JP-A-59-134540 and JU-A-61-99960 propose the technique which corrects the bend of the primary electron beam by the secondary electron leading-out field by a deflection magnetic field generated by a correction excitation coil.

To reduce the influences of the secondary electron leading-out field on the primary electron beam, JP-A-61-131353 proposes a technique which covers the optical axis of an objective lens in the vicinity of a secondary electron detector by a shield electrode so as to shield the secondary electron leading-out field.

In accordance with the former system which corrects the bend of the primary electron beam by the deflection magnetic field, however, the correction excitation coil, too, must be adjusted whenever the acceleration voltage is adjusted, because a deflection magnetic field which is most suitable for the correction of the bend of the primary electron beam changes in accordance with the acceleration voltage. Hence, this proposal is not yet free from the problem that the operation is complicated and troublesome.

Another problem with this system is that since the primary electron beam is affected by two forces, that is, the deflection magnetic field and the leading-out electric field, the influences of these forces become irregular and accurate correction is difficult.

In accordance with the latter system which covers the optical axis of the objective lens by the shield electrode, on the other hand, observation by a low acceleration voltage is effective, it is true, but there occur the following problems during the observation by a high acceleration voltage.

When an acceleration voltage exceeds 20 kV, excitation of the objective lens becomes so strong that a low energy secondary electron of about a couple of electron.voltages generated from the sample is vigorously wound up by the magnetic field of the objective lens and the trajectory of the secondary electron is dispersed above the objective lens.

To efficiently collect the secondary electron generated from a wide range of the sample and to make observation over a wide visual field, therefore, the secondary electron leading-out field must be allowed to act sufficiently above the objective lens and the secondary electron must be collected in a broad space.

However, if the optical axis of the objective lens near the secondary electron detector is covered with the shield electrode, the intensity of the secondary electron leading-out field is reduced and the secondary electron can be collected only inside an extremely narrow and limited region on the sample, so that observation over a wide visual field cannot be conducted.

SUMMARY OF THE INVENTION

It is a first object of the present invention to provide a scanning electron microscope which makes it possible to conduct observation over a wide visual field during observation at a high acceleration voltage and to conduct high resolution observation with little influences of an axial error during observation at a low acceleration voltage.

It is a second object of the present invention to provide a scanning electron microscope which has an extremely high operation factor for accomplishing the first object described above, and can reliably execute wide visual field observation at the time of a high acceleration voltage and high resolution observation at the time of a low acceleration voltage.

In a scanning electron microscope for detecting a secondary electron from above an objective lens and obtaining an observation image, the first characterizing feature of the present invention resides in that the microscope includes shield means for shielding an electric field on an optical axis so as to prevent a primary electron beam from being bent by the electric field generated by a secondary electron detector, and moving means for selectively moving the shield means to a first position at which the electric field on the optical axis is shielded and to a second position at which the secondary electron can be sufficiently collected by the electric field described above, so that the shield means can be moved to the first position during observation by a low acceleration voltage and to the second position during observation by a high acceleration voltage.

The second characterizing feature of the present invention resides in that the microscope includes means for setting a reference value and comparing this reference value with an acceleration voltage, and shield means for shielding an electric field on an optical axis generated by a secondary electron detector, and a cylinder is automatically controlled so that the shield electrode is moved to the position of the optical axis when the acceleration voltage is less than the reference value and is moved to position outside the optical axis when the acceleration voltage is above the reference value. In this way, an operator can make observation always under the most optimum state without the, necessity for considering the acceleration voltage.

DESCRIPTION OF THE PREFERRED EMBODIMENT

Figure 1:
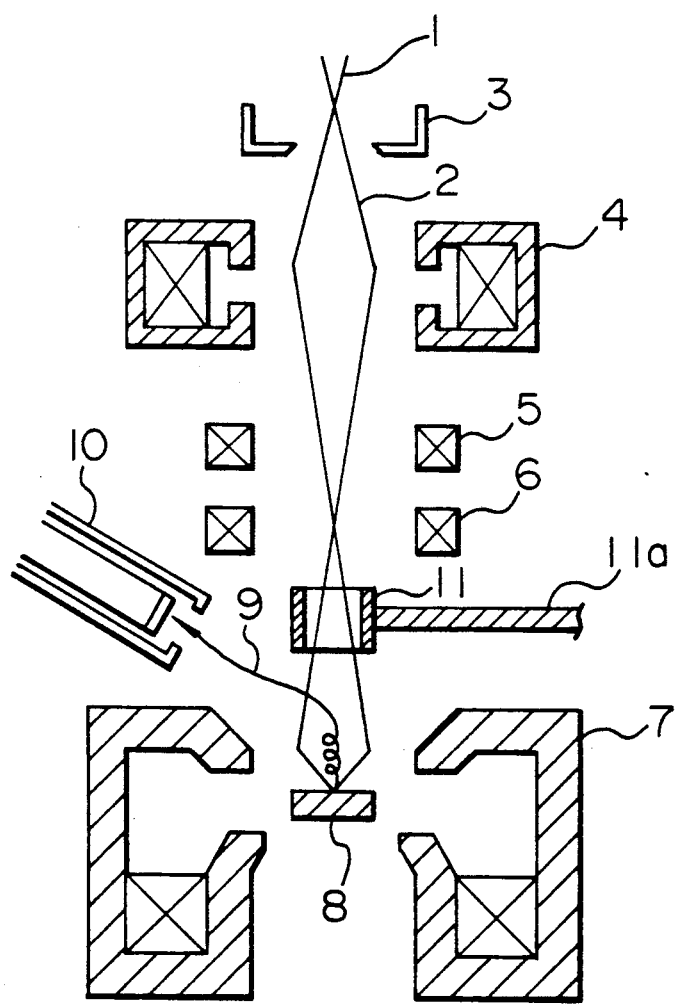
FIG. 1 is a sectional view of principal portions of a scanning electron microscope in accordance with an embodiment of the present invention.

Hereinafter, an embodiment of the present invention will be described with reference to FIGS. 1 to 4.

Electron beams 2 emitted from a cathode 1 are accelerated by an acceleration voltage applied to an anode 3 and travel to a post-stage lens system. The accelerated electron beams 2 are once converged by a convergent lens 4, and are then contracted thinly on a sample 8 and form a spot. The electron beams 2 are deflected in X- and Y-directions by two stages of deflectors 5 and 6, and the spot is scanned two-dimensionally on the sample 8.

On the other hand, the secondary electron 9 which is generated from the sample 8 is accelerated by a secondary electron leading-out field and collected by a secondary electron detector 10.

A cylindrical shield electrode 11 for suppressing the leading-out field by the secondary electron detector 10 is supported at one of the ends of its shaft 11a on the optical axis of the primary electron 2 in the vicinity of the secondary electron detector 10.

The shaft 11a is inserted into an opening 17 of a flange 13 and is extended outside a optical column 12, and an air cylinder 16 is connected to the other end of the shaft. The air cylinder 16 is fixed to the flange 13 through a support post 15. The shaft 11a and the flange 13 are brought into close contact with bellows 14 in the opening 17, so that the interior of the optical column is kept vacuum.

Figure 2A:
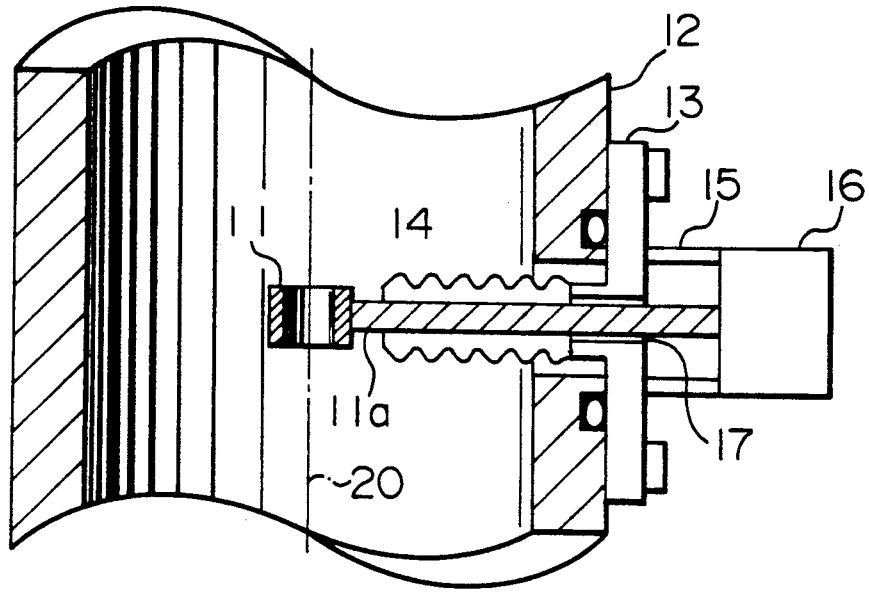
FIG. 2A is a partial enlarged view of FIG. 1 when a shield electrode exists at a position of an Optical axis.

In the construction described above, the air cylinder 16 is operated and the shaft 11a is slid during the observation by a low acceleration voltage so as to mitigate any influences of the secondary electron leading-out field due to the secondary electron detector 10, and the shield electrode 11 is moved to the position shown in FIG. 2A.

In other words, the shield electrode 11 is moved on the optical axis so as to shield the secondary electron leading-out field on the optical axis 20.

Figure 3:
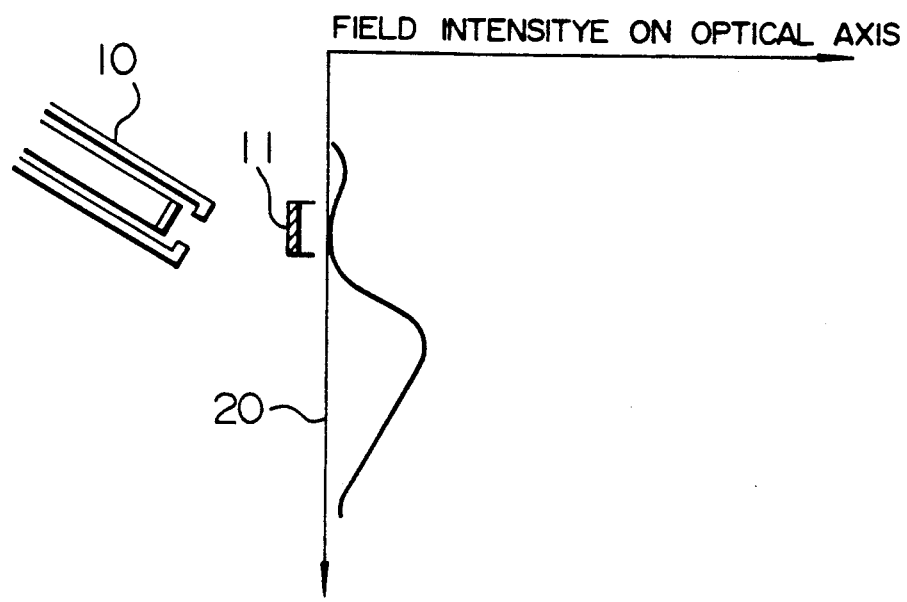
FIG. 3 is a field intensity distribution diagram on the optical axis under the condition shown in FIG. 2A.

The field intensity E in the vicinity of the optical axis at this time becomes such as the one shown in FIG. 3, and observation with high resolution becomes possible while the primary electron is not affected by the leading-out field.

Figure 2B:
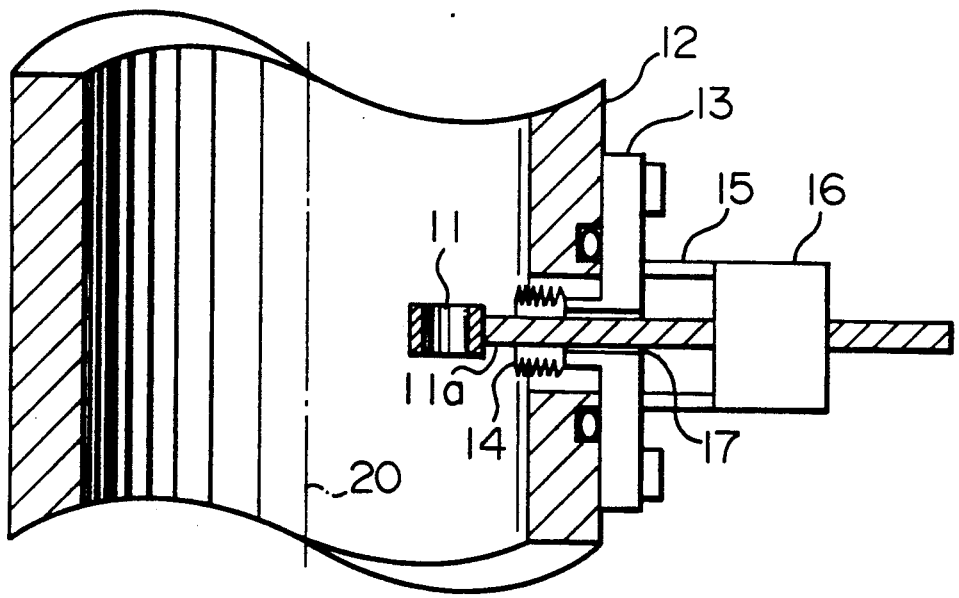
FIG. 2B is a partial enlarged view of FIG. 1 when the shield electrode is moved outside the position of the optical axis.

During the observation by a high acceleration voltage, on the other hand, the air cylinder 16 is operated and the shaft 11a is slid in order to collect the secondary electron in a wide space above the objective lens, and the shield electrode 11 is moved to the position shown in FIG. 2B.

In other words, the shield electrode 11 is moved to the end portion inside the optical column so that the shield electrode 11 does not affect the secondary electron leading-out field and the secondary electrons can be collected sufficiently by the secondary electron leading-out field.

Figure 4:
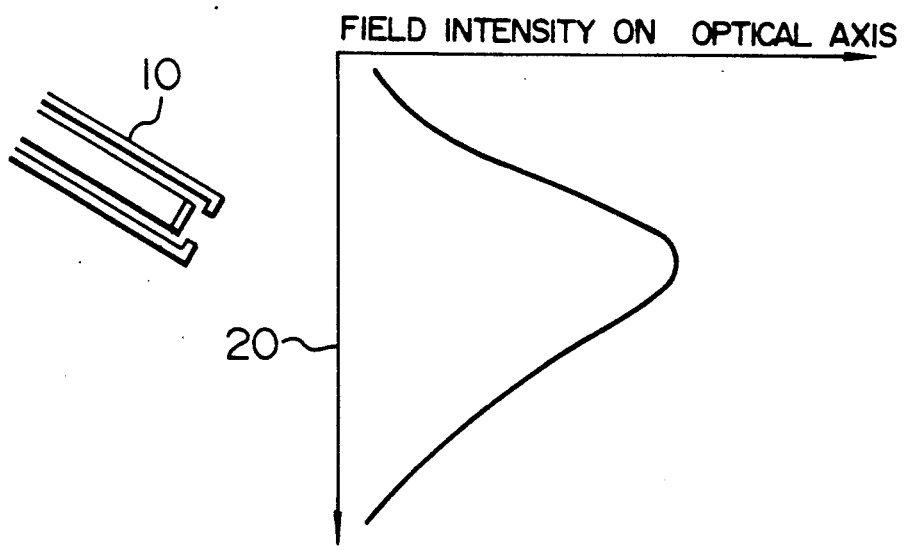
FIG. 4 is a field intensity distribution diagram on the optical axis under the condition shown in FIG. 2B.

The field intensity E in the vicinity of the optical axis at this time becomes such as the one shown in FIG. 4. Since the secondary electron leading-out field operates sufficiently and can collect the secondary electron, the observation can be made over a wide visual field.

The bellows 14 described above can be replaced by an O-ring and the air cylinder 16 can be replaced by an electromagnetic cylinder, as well.

Next, another embodiment of the present invention will be described with reference to FIG. 5.

In the embodiment given above, the shield electrode 11 is operated by an operator but in this embodiment, the shield electrode 11 is controlled automatically.

Figure 5:
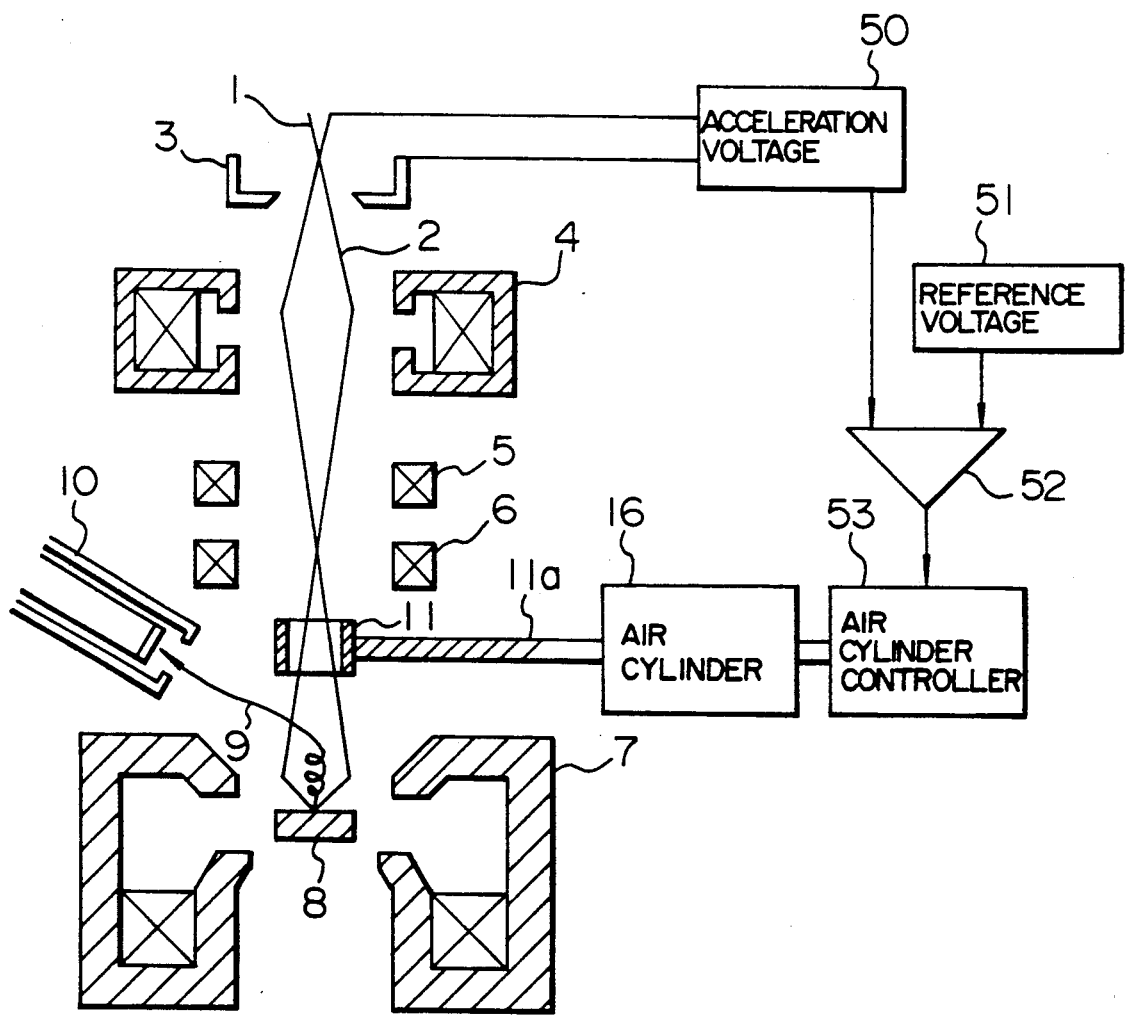
FIG. 5 is a sectional view of principal portions of a scanning electron microscope in accordance with another embodiment of the present invention.

In FIG. 5, like reference numerals are used to identify like constituents as in FIG. 1 and the explanation of such constituents will be omitted. To accomplish the automatic control described above this embodiment disposes a comparator 52 for setting a reference voltage 51 and comparing this reference voltage 51 with the acceleration voltage 50, and a controller 53 for controlling the air cylinder 16 in accordance with the output of this comparator 52. The cylinder controller 53 controls the air cylinder 16 in such a fashion that when the acceleration voltage 50 is less than the reference voltage 51, the shield electrode 11 is moved to the position shown in FIG. 2A and when the acceleration voltage 50 is above the reference voltage 51, the shield electrode 11 is moved to the position shown in FIG. 2B. Accordingly, the operator can always make the observation under the optimum state without considering the acceleration voltage.

In accordance with the present invention described above, the shield electrode can be moved in accordance with the level of the acceleration voltage. Therefore, when the shield electrode is moved on the optical axis during the observation by the low acceleration voltage, the shield electrode shields the field generated by the secondary electron detector in the vicinity of the optical axis and hence, high resolution observation becomes possible with little influence of the axial error.

If the shield electrode is moved to the end portion inside the optical column during the observation by the high acceleration voltage, the shield electrode does not affect the secondary electron leading-out field and the secondary electron can be collected sufficiently by the secondary electron leading-out field. For this reason, the secondary electron can be collected in a wide space above the objective lens and the observation can be made over a wide visual field.

I claim:

1. A scanning electron microscope for detecting a secondary electron from a sample by a secondary electron detector disposed above an objective lens and obtaining an observation image, comprising:

shield means for shielding an electric field on an optical axis by said secondary electron detector; and moving means for moving selectively said shield means to a first position at which said shielding means shields the electric field on said optical axis and to a second position at which collection of the secondary electron by said electric field is promoted.

2. A scanning electron microscope according to claim 1, wherein said shield means comprises a cylindrical shield electrode, said first position is the position where said optical axis exists inside said cylindrical shield electrode, and said second position is the position where said optical axis exists outside said cylindrical shield electrode.

3. A scanning electron microscope according to claim 1, wherein said moving means comprises a support shaft connected to said shield means and penetrating through and outside an optical column of said microscope, and a cylinder disposed outside said optical column and driving said support shaft.

4. A scanning electron microscope according to claim 3, wherein a flange is fixed to an opening on the side surface of said optical column, said support shaft penetrates through the opening defined by said flange, said shield means is connected to one of the ends of said support shaft, said cylinder is connected to the other end of said support shaft, and one of the ends of bellows is connected to said support shaft with the other being connected to said cylinder.

5. A scanning electron microscope according to claim 1, wherein a sample is disposed in the gap of said objective lens, and said shield means is disposed above said objective lens.

6. In a scanning electron microscope including acceleration voltage setting means for setting an acceleration voltage of a primary electron beam, an objective lens for focusing said primary electron beam accelerated by said acceleration voltage to a sample through a convergent lens and through deflectors, and a secondary electron detector disposed above said objective lens, the improvement comprising:
   means for setting a reference voltage to be compared with said acceleration voltage;
   shield means for shielding an electric field on an optical axis generated by said secondary electron detector;
   means for comparing said acceleration voltage with said reference value; and
   moving means for moving relatively said shield means with respect to said optical axis in accordance with the output of said comparison means.

7. A scanning electron microscope according to claim 6, wherein said moving means moves said shield means to a first position when said acceleration voltage is smaller than said reference value, and moves said shield means to a second position, at which the shield of the electric field on said optical axis is reduced, when said acceleration voltage is greater than said reference value.

* * * * *